United States Patent
Heinemann et al.

(10) Patent No.: US 7,069,652 B2
(45) Date of Patent: Jul. 4, 2006

(54) METHOD FOR PRODUCING LAMINATED SMART CARDS

(75) Inventors: Erik Heinemann, Regensburg (DE); Frank Püschner, Kelheim (DE)

(73) Assignee: Infineon Technologies AG, Munich (DE)

( * ) Notice: Subject to any disclaimer, the term of this patent is extended or adjusted under 35 U.S.C. 154(b) by 259 days.

(21) Appl. No.: 10/264,873

(22) Filed: Oct. 4, 2002

(65) Prior Publication Data

US 2003/0064544 A1 Apr. 3, 2003

Related U.S. Application Data

(63) Continuation of application No. PCT/DE01/01332, filed on Apr. 4, 2001.

(30) Foreign Application Priority Data

Apr. 4, 2000 (DE) ................. 100 16 715

(51) Int. Cl.
*H01K 3/10* (2006.01)
(52) U.S. Cl. .............. 29/852; 29/830; 29/846; 257/679; 257/704; 174/52.1; 174/52.3; 174/52.4; 438/108; 438/125; 438/456; 438/106
(58) Field of Classification Search ............. 29/846, 29/852, 830; 438/108, 125, 126, 456, 106; 257/679, 704, 680
See application file for complete search history.

(56) References Cited

U.S. PATENT DOCUMENTS

| | | | | |
|---|---|---|---|---|
| 4,931,853 A | * | 6/1990 | Ohuchi et al. | 257/679 |
| 5,976,391 A | * | 11/1999 | Belke et al. | 216/13 |
| 6,271,469 B1 | * | 8/2001 | Ma et al. | 174/52.4 |

FOREIGN PATENT DOCUMENTS

| | | |
|---|---|---|
| DE | 196 02 821 C1 | 6/1997 |
| EP | 0 249 266 A1 | 12/1987 |
| EP | 0 706 152 A2 | 4/1996 |
| EP | 0 952 543 A1 | 10/1999 |
| FR | 2 775 810 | 9/1999 |
| WO | WO 95/21423 | 8/1995 |
| WO | WO 97/18531 | 5/1997 |
| WO | WO 97/27564 | 7/1997 |

\* cited by examiner

*Primary Examiner*—Richard Chang
(74) *Attorney, Agent, or Firm*—Laurence A. Greenberg; Werner H. Stemer; Ralph E. Locher

(57) ABSTRACT

A smart card is laminated from at least two layers of paper or film as a mounting material. A first of the layers is fitted with a semiconductor chip and a second layer has connecting contacts as well as conductor tracks or external connecting surfaces. The contacts of the semiconductor chips are electrically conductively connected to the connecting contacts on the second layer. No chip modules are required to produce the smart cards. The mounting materials provided with ICs and contacts can be laminated in an endless roll format, in the same way as for paper production.

5 Claims, 2 Drawing Sheets

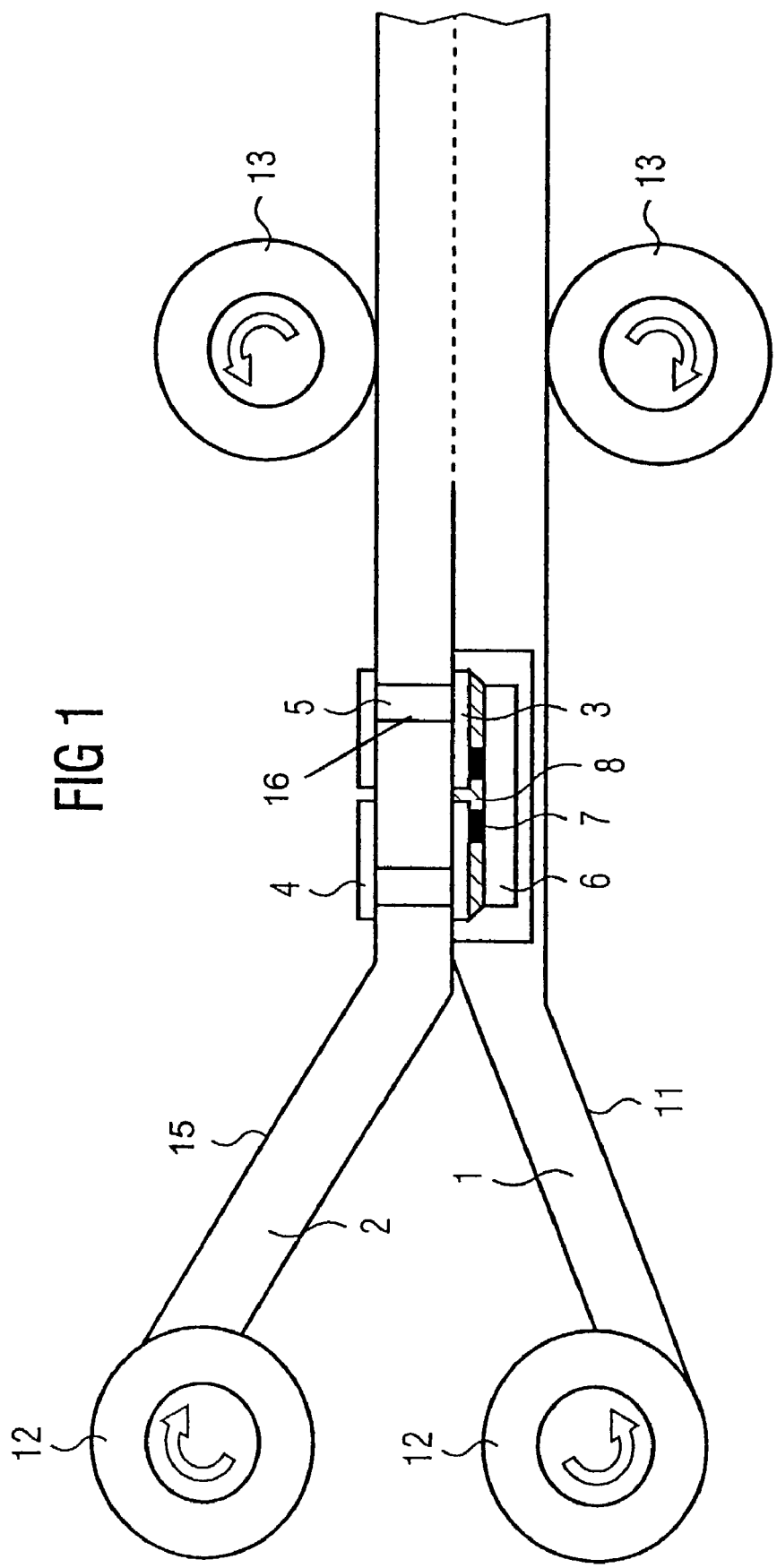

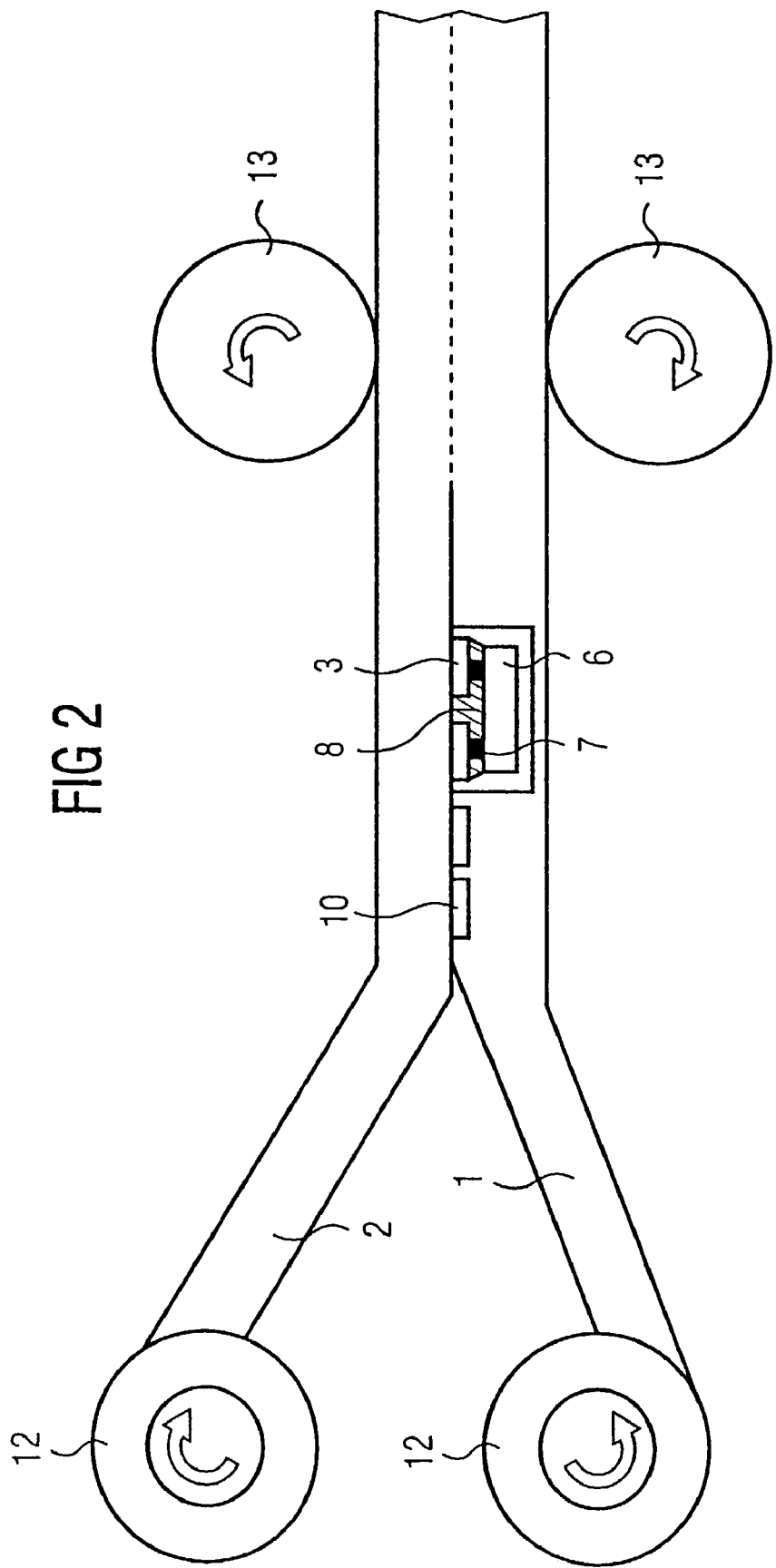

METHOD FOR PRODUCING LAMINATED SMART CARDS

CROSS-REFERENCE TO RELATED APPLICATION

This application is a continuation of copending International Application No. PCT/DE01/01332, filed Apr. 4, 2001, which designated the United States and was not published in English.

BACKGROUND OF THE INVENTION

Field of the Invention

Nowadays, smart cards are also in use for applications which are restricted to a specific time or in which the smart card can be used only a small number of times. One example of this is a telephone prepayment card, in which card, a certain number of telephone units are stored for consumption. Since, in applications such as this, the individual smart card does not provide any use in its own right and has only a memory content with a small value, the smart card itself must make up only a small proportion of the purchasing price, which must in any case be kept low, for financial reasons. A card material, card structure and production methods are therefore sought by which the smart card can be produced as cost-effectively as possible.

International Patent Disclosure WO 95/21423 describes smart cards that can be produced from paper and in which a smart card module is laminated between paper layers. The smart card module contains at least one semiconductor chip with an integrated circuit, as well as its electrical connections in accordance with the smart card standard. In the case of smart cards that operate without making contact, conductor tracks that act as antennas are fitted in the smart card module and are electrically conductively connected to the semiconductor chip. The production of the laminate makes use of conventional techniques for paper production. The various layers are adhesively bonded together and are pressed together; cut-outs in the paper are stamped or milled in order to hold the smart card module. The smart card module, including the connecting contacts and a mounting element for the semiconductor chip, is produced independently of the paper layer laminate.

International Patent Disclosure WO 97/18531 describes a smart card in which a plastic layer is connected to an IC chip, which is laminated in it, by an insulating layer, which is printed with conductors on both sides, as a substrate, such that the connections of the IC chip are electrically conductively connected to the conductors which face it on the insulating layer.

European Patent Application EP 0 706 152 A2 describes a smart card and a production method, in which the chip is mounted, without producing any module, using flip-chip technology on conductors which are fitted on a film, and, on the rear face, is laminated into a core film as well as an outer film. Through-contacts to external contacts are provided in the film.

International Patent Disclosure WO 97/27564 describes a smart card with a laminated-in chip module, which is produced by use of laminating roller pairs that can be heated.

SUMMARY OF THE INVENTION

It is accordingly an object of the invention to provide a method for producing laminated smart cards that overcomes the above-mentioned disadvantages of the prior art methods of this general type, which produces smart cards in large quantities and cost-effectively.

With the foregoing and other objects in view there is provided, in accordance with the invention, a method for producing a smart card. The method includes providing a first mounting material containing at least one semiconductor chip having an integrated circuit with at least one contact. The first mounting material is a strip of paper, a web of paper, a strip of film or a web of film. A second mounting material is provided and contains at least one connecting contact. The second mounting material is also a strip of paper, a web of paper, a strip of film, or a web of film. The first mounting material is permanently connected to the second mounting material by contact pressure and/or adhesive bonding, such that the contact of the semiconductor chip is electrically conductively connected to the connecting contact. The first mounting material containing the semiconductor chip and the second mounting material containing the connecting contact is cut or stamped to complete the smart card.

The smart card produced according to the invention is laminated from at least two layers of a thin mounting material such as paper or film, with one layer in each case being fitted with the semiconductor chip that is provided for a smart card, and the second layer having connecting contacts as well as conductor tracks or external connecting surfaces, which are intended for signal and power transmission. The semiconductor chips are fitted in the one layer such that their contacts face the other layer. The layers are connected to one another such that the contacts of the semiconductor chips are electrically conductively connected to the connecting contacts of the other layer. In the case of the smart card that is provided with external connecting surfaces, the connecting contacts that are provided for making contact with the semiconductor chips, and the external connecting surfaces, are disposed on two mutually opposite sides of one layer. An electrically conductive connection between them is made through cut-outs or apertures in the mounting material for the layer. The smart cards can thus be produced without using a smart card module with, in particular, the mounting materials being able to be unwound from rolls as strips or webs, and being able to be supplied to an apparatus, which is known in principle from paper production, for producing the laminates.

In accordance with an added mode of the invention, there is the step of using rollers for mounting and transporting the first and second mounting materials.

In accordance with another mode of the invention, there are the steps of forming an aperture in the second mounting material, and coating both sides of the second mounting material with an electrically conductive material in a predetermined structured format to form the at least one connecting contact, at least one connecting surface disposed on a side of the second mounting material opposite the connecting contact, and an electrically conductive connection disposed in the aperture between the connecting contact and the connecting surface.

In accordance with a concomitant feature of the invention, there is the step of coating the second mounting material with an electrically conductive material having a predetermined structure to form the at least one connecting contact and at least one conductor track connected to the connecting contact.

Other features which are considered as characteristic for the invention are set forth in the appended claims.

Although the invention is illustrated and described herein as embodied in a method for producing laminated smart cards, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic view of a configuration for producing a smart card with external connecting surfaces according to the invention; and FIG. 2 is a diagrammatic view of the configuration for producing the smart card without contacts.

DESCRIPTION OF THE PREFERRED EMBODIMENTS

Referring now to the figures of the drawing in detail and first, particularly, to FIG. 1 thereof, there is shown mounting materials 1, 2, which are provided for two layers which are at least present, in a side view in a configuration for producing smart cards. A semiconductor chip 6 is inserted in the first mounting material 1, which is intended to form a first layer of the smart card. In one preferred production method, a large number of smart cards are produced from one strip or one web of the mounting materials, and are separated only after the mounting materials 1, 2 have been connected. For the sake of simplicity, FIG. 1 shows one configuration with only one semiconductor chip 6 in the first mounting material 1, in the form of a cross section. It should be imagined that there are further semiconductor chips adjacent to the semiconductor chip 6 to the left and right, and possibly also into the plane of the drawing, which are each intended for further smart cards. Each semiconductor chip 6 is disposed in the first mounting material 1, preferably being inserted into a cut-out. The cut-out may pass completely through the thin mounting material 1, or there may only be a recess, which leaves a rear face 11 of the first mounting material 1 intact. Further layers for covering the semiconductor chip 6 from the rear face may be applied to the rear face 11, or may be applied to the rear face 11 or may be applied in a final production step.

Connecting contacts 3, by which the contacts of the semiconductor chip 6 are connected via electrically conductive connections 7 (for example so-called bumps composed of soft solder such as NiAu) during production of the laminate, are fitted in or on the side of the second mounting material 2 that faces the semiconductor chip 6. In the exemplary embodiment shown in FIG. 1, connecting surfaces 4, which are intended for making external contact between the smart card and, for example, the connecting contacts of a terminal, are located on an outer face 15 of the second mounting material 2, facing away from the semiconductor chip 6. For an electrically conductive connection 5, an electrically conductive material is located in apertures 16, which are produced in the second mounting material 2 before the application of the electrically conductive materials that are intended for the connecting contacts and the connecting surfaces 4. Once the smart cards have been separated, the first mounting material 1 forms a first layer with the semiconductor chips 6 fitted in it, and the second mounting material 2 forms the second layer 2, with the connecting contacts 3 intended for electrical connections, the electrically conductive connections 5 provided in the apertures 16, and the external connecting surfaces 4.

In the configuration illustrated in FIG. 1, the mount materials 1, 2 are unwound from rolls 12, as is also done when producing paper or cardboard using so-called endless roll formats. The further transportation of the mounting materials that have been connected to one another is indicated in FIG. 1 by rollers 13 that are shown, which compress the laminate (which is formed from the layers) during transportation and which are preferably disposed at various points along the web of the mounting material in the apparatus. The rollers 13 may be provided with heating devices, which heat the mounting materials 1, 2 such that an adhesive layer that is inserted between the mounting materials 1, 2, for example a layer of adhesive, provides better adhesion. Heating may also be provided via a heating part that is pressed on from the outside, in this case as well preferably a heating roller which rolls at the same time, in order to produce the electrically conductive connections 7 between the contacts of the semiconductor chip 6 and the connecting contacts 3.

The smart card produced according to the invention is thus composed of at least two layers, although modifications with a greater number of layers are also within the scope of the invention. The essential feature in this case is that the semiconductor chip 6 is integrated directly in one layer, as an IC chip. The electrical conductors 3 for connection are fitted in or on a further layer. Paper or film in the endless roll format is particularly suitable as the mounting material. The connecting contacts 5 and/or connecting surfaces 4 that are provided on the second layer may preferably be produced using an endless screen-printing method by which, for example, an electrically conductive paste is applied in a thin layer, and is structured in the process. The contacts of the IC 6 are connected to the connecting contacts 3 of the second layer in a similar way to that in the method, which is known per se, for flip-chip mounting of semiconductor chips 6.

In order to improve the electrically conductive connections 7 which are produced with the contact pads or soft-solder bumps, a filling compound 8 (underfill) may be provided between the semiconductor chip 6 and the second layer, which is formed by the second mounting material 2, with the filling compound 8 (underfill) preferably being formed from an anisotropically electrically conductive material. The material is aligned such that the greatest conductivity is provided in the direction of the intended conductive connections 7, while the conductivity transversely with respect to this direction, that is to say in the plane of the connection of the mount materials 1, 2, is as low as possible, in order to avoid short circuits between the various contacts. Isotropically conductive or insulating filling compounds 8 may also be used, in which case it is advantageous if the filling compounds 8 are subject to at least slight shrinkage after being applied and after the connection of the mounting materials 1, 2, so that the electrically conductive connections 7 are pressed against the contacts of the semiconductor chip 6 and the connecting contacts 3 on the second layer 2, in this way achieving a sufficiently rigid, force-fitting, electrically conductive connection 7.

A smart card without contacts can be produced according to the invention in a manner that is analogous to this exemplary embodiment. Then, instead of the connecting surfaces 4 which are fitted on the second mounting material 2, a conductor track 10 (see FIG. 2) is applied and is structured on the inner surface, which is provided with the connecting contacts 3. A conductor track 10 such as this may be in the form of a spiral coil, which is intended as an antenna for signal transmission and power transmission. The other components and the production method for the smart card as shown in FIG. 2 correspond to the smart cards already described with reference to FIG. 1. The second mounting material 2 is preferably provided with an electrically conductive structuring only on the side that faces the semiconductor chip 6. As in the case of the already described exemplary embodiment, the laminate may be composed of more than two layers. In principle, however, the refinements as shown in FIGS. 1 and 2 can also be combined with one another if, for example, a smart card is desired which is suitable not only for external electrical connection but also for use without contacts.

We claim:

1. A method for producing a smart card, which comprises the steps of:
   providing a first mounting material containing at least one semiconductor chip having an integrated circuit with at least one contact at a surface being left free from the first mounting material;
   providing a second mounting material having at least one aperture formed therein;
   providing an electrically conductive via within the at least one aperture;
   coating both sides of the second mounting material with an electrically conductive material in a predetermined structured format for forming at least one connecting contact, at least one connecting surface disposed on a side of the second mounting material opposite the connecting contact, the via being an electrically conductive connection between the at least one connecting contact and the at least one connecting surface;
   using rollers for mounting and transporting the first and second mounting materials;
   permanently connecting the first mounting material to the second mounting material by at least one of contact pressure and adhesive bonding, such that the contact of the semiconductor chip being electrically conductively connected to the connecting contact; and
   performing one of cutting and stamping the first mounting material and the second mounting material to complete the smart card.

2. The method according to claim 1, which comprises coating the second mounting material with an electrically conductive material having a predetermined structure to form the at least one connecting contact and at least one conductor track connected to the connecting contact.

3. A method for producing smart cards, which comprises the steps of:
   providing a first mounting material containing semiconductor chips each having an integrated circuit with at least one chip contact;
   providing a second mounting material containing connecting contacts on one side and connecting surfaces on an opposite side, each of the connecting contacts being electrically conductively connected to a respective one of the connecting surfaces;
   permanently connecting the first mounting material to the second mounting material by at least one of contact pressure and adhesive bonding, such that the contact of the semiconductor chips being electrically conductively connected to the connecting contacts; and
   performing one of cutting and stamping the first mounting material and the second mounting material between the semiconductor chips to remove individual ones of the smart cards.

4. The method according to claim 3, which comprises using rollers for mounting and transporting the first and second mounting materials.

5. The method according to claim 3, which comprises coating the second mounting material with an electrically conductive material having a predetermined structure to form the connecting contacts and conductor tracks connected to the connecting contacts.

* * * * *